US008796691B2

(12) United States Patent
Lin et al.

(10) Patent No.: US 8,796,691 B2
(45) Date of Patent: Aug. 5, 2014

(54) SYSTEM FOR DISPLAYING IMAGES AND FABRICATING METHOD THEREOF

(75) Inventors: Chieh-Wen Lin, Longjing Township, Taichung County (TW); Chih-Chieh Wang, Kaohsiung (TW); Sheng-Wen Chang, Yangmei Township, Taoyuan County (TW); Te-Chang Wan, Taipei (TW)

(73) Assignee: Innolux Corporation (TW)

( * ) Notice: Subject to any disclaimer, the term of this patent is extended or adjusted under 35 U.S.C. 154(b) by 790 days.

(21) Appl. No.: 12/559,181

(22) Filed: Sep. 14, 2009

(65) Prior Publication Data

US 2010/0065852 A1 Mar. 18, 2010

Related U.S. Application Data

(60) Provisional application No. 61/097,921, filed on Sep. 18, 2008.

(30) Foreign Application Priority Data

Oct. 29, 2008 (TW) .............................. 97141561 A

(51) Int. Cl.
*H01L 27/14* (2006.01)
(52) U.S. Cl.
USPC ................... 257/72; 257/52; 257/84; 257/99; 257/E33.058

(58) Field of Classification Search
USPC .................. 257/72, 359, E23.179, 52, 84, 99, 257/E33.058
See application file for complete search history.

(56) References Cited

U.S. PATENT DOCUMENTS

| 2005/0030463 A1* | 2/2005 | Kaneko et al. | 349/147 |
| 2005/0130353 A1* | 6/2005 | Yoo et al. | 438/151 |
| 2006/0084240 A1* | 4/2006 | Poo et al. | 438/460 |

FOREIGN PATENT DOCUMENTS

JP 8213631 8/1996

OTHER PUBLICATIONS

Office Action dated Dec. 16, 2011 from corresponding application No. CN 200810172104.5.

* cited by examiner

*Primary Examiner* — Dale E Page
(74) *Attorney, Agent, or Firm* — Lowe Hauptman & Ham, LLP

(57) ABSTRACT

A system for displaying images and fabricating method thereof are provided. The system includes a thin film transistor substrate including a substrate having a display area and a pad area. The thin film transistor substrate further includes a conductive line disposed on the substrate in the display area. The conductive line includes a lower metal line, an upper metal line and a middle metal line therebetween. The width of the middle metal line is narrower than that of the upper metal line.

2 Claims, 7 Drawing Sheets

SYSTEM FOR DISPLAYING IMAGES AND FABRICATING METHOD THEREOF

CROSS REFERENCE TO RELATED APPLICATIONS

This application claims the benefit of U.S. Provisional Application No. 61/097,921, filed on Sep. 18, 2008, the entirety of which is incorporated by reference herein.

This Application claims priority of Taiwan Patent Application No. 097141561, filed on Oct. 29, 2008, the entirety of which is incorporated by reference herein.

BACKGROUND

1. Field of the Invention

The present invention relates to a system for displaying images and fabricating method thereof, and in particular, to conductive lines and bonding pads of a thin film transistor substrate in a display area and a pad area and fabricating method thereof.

2. Description of the Related Art

Recently, liquid crystal displays have been widely applied as a display element for various products. To improve display quality of liquid crystal displays, the aperture ratio of liquid crystal displays must be improved while avoiding light leakage.

For conventional fabricating processes of display panels, however, scan lines and data lines disposed in the liquid crystal displays usually have tapered shapes. Thus, when conventional thin film substrates of liquid crystal displays are irradiated by back light modules of a system for displaying images, the tapered conductive lines reflect light, thereby resulting in light leakage of liquid crystal displays.

To solve the above-described light leakage problem, an additional blocking metal layer can be disposed below the scan lines or the data lines to block light irradiated from the conductive lines by the back light module, thereby preventing light reflection. The additional blocking metal layer, however, reduces aperture ratio of a liquid crystal display, resulting in reduced brightness and quality of liquid crystal displays. Another method to solve the above-described light leakage problem is to dispose a silicon nitride layer ($SiN_x$) on the scan lines and the data lines. But, additional processes for formation of the silicon nitride layer, for example, chemical vapor deposition (CVD), photolithography and etching processes, increases fabrication costs.

Therefore, a system for displaying images and fabricating method thereof to solve the light leakage problem, while achieving better display quality is needed.

BRIEF SUMMARY

To solve the above-described problems, a system for displaying images and fabricating method thereof are provided. An exemplary embodiment of a method for fabricating a system for displaying images, comprises providing a substrate comprising a display area and a pad area. A lower metal layer, a middle metal layer and an upper metal layer are sequentially formed on the substrate. The upper metal layer, the middle metal layer and the lower metal layer are anisotropically etched to form a conductive line in the display area, wherein the conductive line comprises a lower metal line, an upper metal line and a middle metal line therebetween. The middle metal line is isotropically etched, whereby a width of the middle metal line is narrower than that of the upper metal line and the lower metal line.

An exemplary embodiment of a method for fabricating a system for displaying images, comprises providing a thin film transistor substrate, comprising a substrate having a display area and a pad area. A conductive line is disposed on the substrate in the display area comprising a lower metal line, an upper metal line and a middle metal line therebetween, wherein a width of the middle metal line is narrower than that of the upper metal line.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 4d' to 4e' are cross section views showing a fabrication process for yet another exemplary embodiment of conductive lines and bonding pads of the invention.

DETAILED DESCRIPTION

Figure 1:
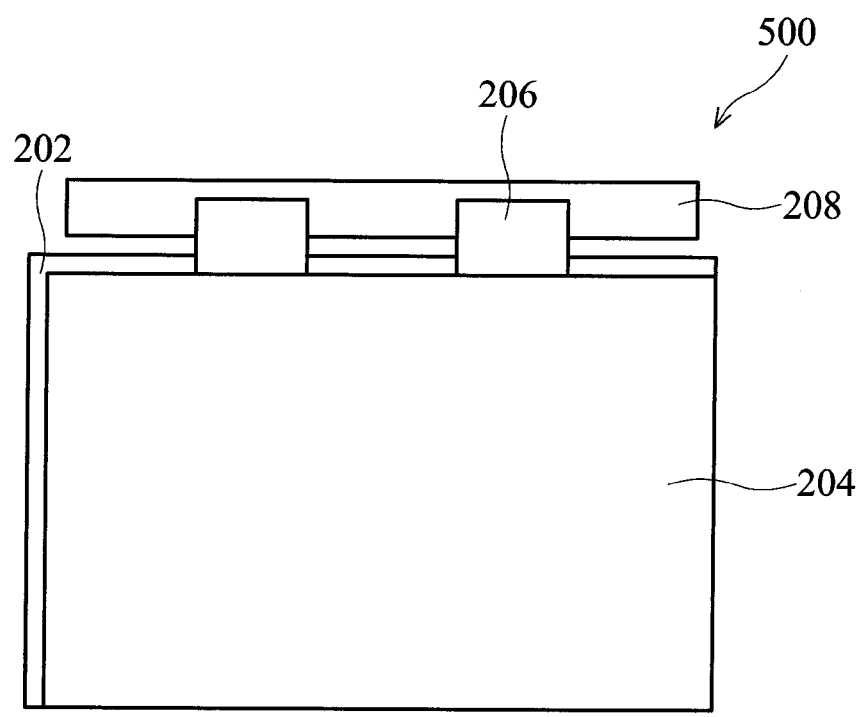
FIG. 1 schematically shows one exemplary embodiment of a liquid crystal display panel of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

Figure 2:
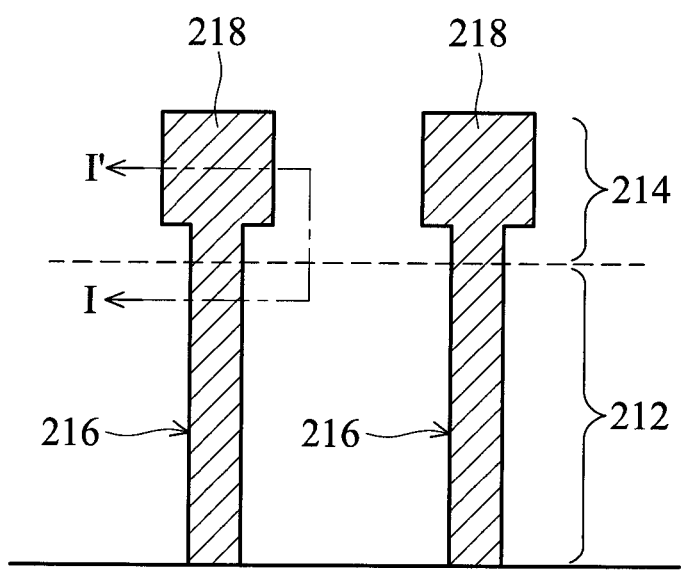
FIG. 2 shows one exemplary embodiment of conductive lines and bonding pads of the invention.

Referring to FIGS. 1 and 2, FIG. 1 schematically shows one exemplary embodiment of a liquid crystal display panel 500 of the invention. In one embodiment, the liquid crystal display panel 500 may comprise a low temperature poly-silicon liquid crystal display panel. The liquid crystal display panel 500 comprises a thin film transistor substrate 202, a color filter substrate 204 and a liquid crystal material (not shown) filling a space sandwiched by the thin film transistor substrate 202 and the color filter substrate 204. A plurality of scan lines and data lines are disposed on the thin film transistor substrate 202 to define a plurality of pixel areas. Each of the pixel areas comprises a pixel electrode and a thin film transistor (TFT) serving as a switch therein.

FIG. 2 shows one exemplary embodiment of conductive lines 216 in a display area 212 and a pad area 214 and bonding pads 218 serving as an inner terminal of the thin film transistor substrate 202 of the invention. As shown in FIG. 2, the thin film transistor substrate 202 has a display area 212 and a pad area 214. The thin film transistor substrate 202 comprises a plurality of conductive lines 216 covering the thin film transistor substrate 202. Each of the conductive lines 216 has an extending portion extending to the pad area 214, serving as a bonding pad 218. The conductive lines 216 may comprise scan lines or data lines, which are used to define a pixel array. In one embodiment, the conductive lines 216, for example, the data lines, are electrically connected to the bonding pad 218 on the pad area 214 as shown in FIG. 2 and an external IC board 208 through a signal processing band 206, such as a TAB (Tape Automated Bonding) band or a FPCB (Flexible Printed Circuit Board). Further, an anisotropic conductive adhesive may be disposed between the bonding pad 218 and the signal processing band 206 to improve adhesive capability between the bonding pad 218 and the signal processing band 206.

Figure 3A:
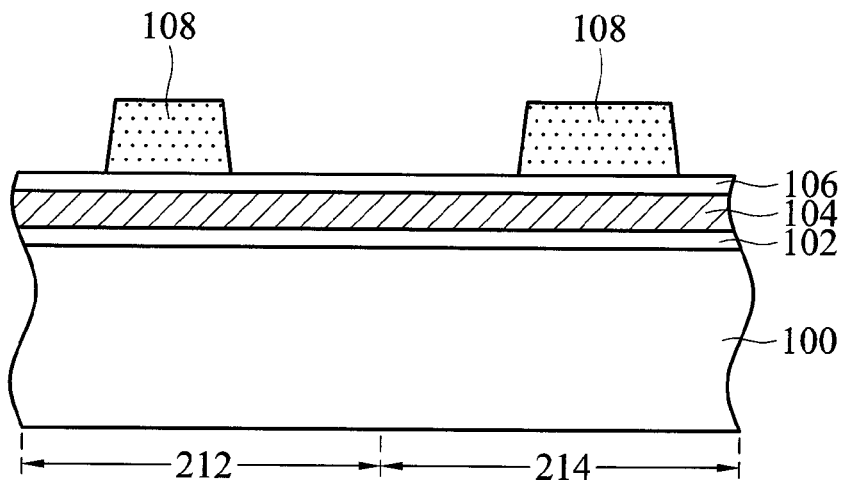
FIGS. 3a to 3d are cross section views showing a fabrication process for one exemplary embodiment of conductive lines and bonding pads of the invention.

FIGS. 3a to 3d are cross section views showing a fabrication process for one exemplary embodiment of conductive lines and bonding pads of the invention. First, as shown in FIG. 3a, a substrate 100 formed by transparent materials comprising glass or quartz, comprising a display area 212 and a pad area 214 is provided. The display area 212 is an area for forming a thin film transistor array.

Next, a metal layer is formed on the substrate 100, and the metal layer is then patterned to form gates and scan lines. Next, devices of a thin film transistor such as gate insulating layers, and polysilicon active layers (not shown) serving as a carrier channel are formed.

Next, a lower metal layer 102, a middle metal layer 104 and an upper metal layer 106 are formed on the substrate 100, sequentially. The upper metal layer 106 and the lower metal layer 102 may comprise Ti, Ta, Mo, Cr or alloys thereof. The middle metal layer 104 may comprise Al or alloys thereof having high reflection. A photoresist pattern 108 is then formed on the upper metal layer 106 to serve as an etching mask using a photolithography process.

Figure 3B:
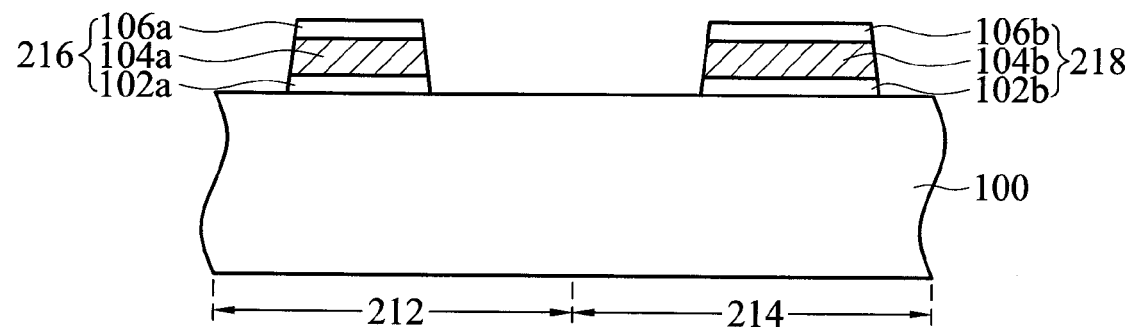

Next, referring to FIG. 3b, the upper metal layer 106, the middle metal layer 104 and the lower metal layer 102 are etched anisotropically to form a conductive line 216 in the display area 212 using a dry etching process. The conductive line 216 comprises a lower metal line 102a, an upper metal line 106a and a middle metal line 104a therebetween. A bonding pad 218 may be also formed in the pad area 214 simultaneously. The bonding pad 218 comprises a lower metal bonding pad 102b, a middle metal bonding pad 104b and an upper metal bonding pad 106b. Further, the bonding pad 218 has a tapered shape and smooth sidewalls. Source/drain electrodes of the thin film transistor array are also defined at the same time as forming the conductive line 216. The photoresist pattern 108 is then removed.

Figure 3C:
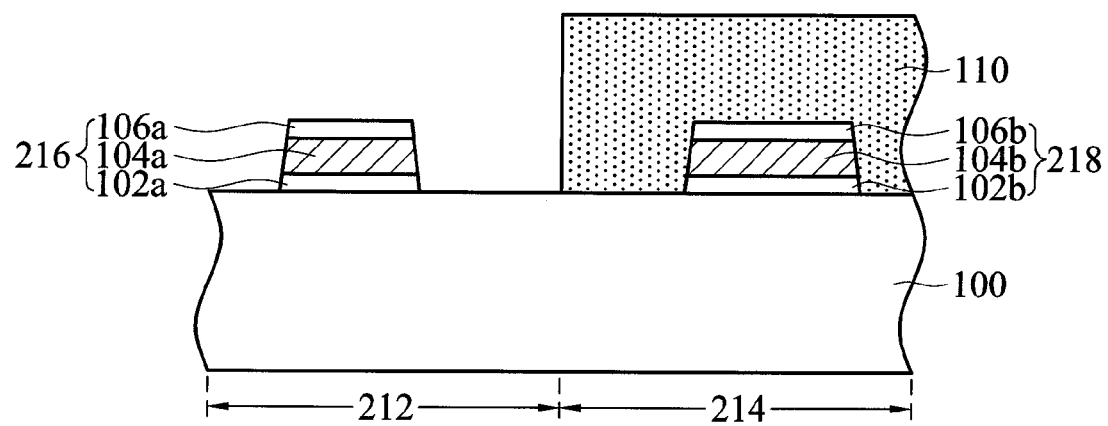

Referring to FIG. 3c, a photoresist pattern 110 is formed in the pad area 214 using a photolithography process again to protect the bonding pad 218.

Figure 3D:
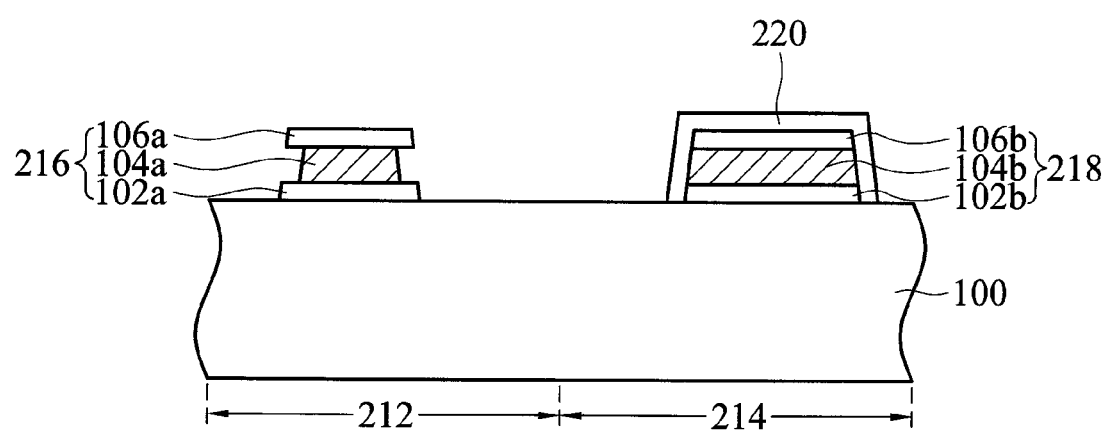

Next, referring to FIGS. 3c and 3d, the middle metal line 104a is etched isotropically using a wet etching process, whereby a width of the middle metal line 104a is narrower than that of the upper metal line 106a. Also, the width of the middle metal line 104a is narrower than that of the lower metal line 102a. The term "width" means the width of the bottom surfaces of the upper, middle and lower metal lines. An etching velocity of an etchant used for wet etching for the middle metal line 104a can be much faster than that of the upper metal line 106a and the lower metal line 102a, such that the middle metal line 104a is concaved because the sidewalls thereof is etched and the upper metal line 106a and the lower metal line 102a are slightly etched or not etched at all. Alternatively, a proper reaction gas may be optionally selected to perform the dry etching process such that an etching selectivity ratio of the middle metal line 104a and the lower (upper) metal line 102a (106a) is larger than 10. Next, the photoresist pattern 110 is stripped. A conductive protection layer 220 may be formed on a top surface and sidewalls of the bonding pad 218 while forming the pixel electrodes to prevent the bonding pad 218 (especially the middle metal pad 104b) in the pad region 214 to form oxidation by mist. The conductive protection layer 220 may comprise transparent materials such as indium tin oxide (ITO) or indium zinc oxide (IZO). After the pixel electrodes are formed, the formation of the thin film transistor substrate is completed.

FIG. 3d illustrates the conductive line 216 and the bonding pad 218 of the system for displaying images. Also, FIG. 3d is a cross section along line I-I' of FIG. 2. The system for displaying images comprises a substrate 100 having a display area 212 and a pad area 214. A conductive line 216 is disposed on the substrate 100 in the display area 212 comprising a lower metal line 102a, an upper metal line 106a and a middle metal line 104a therebetween, wherein a width of the middle metal line 104a is narrower than that of the upper metal line 106a and the lower metal line 102a. When a backlight source passes through the conductive line 216 as shown in FIG. 3d, the upper metal line 106a or the lower metal line 102a can block the reflection of the middle metal line 104a because the middle metal line 104a has a narrower width. Thus, the light leakage problem of conventional liquid crystal displays due to light reflection is avoided and the display quality of a system for displaying images can be improved.

Figure 4A:
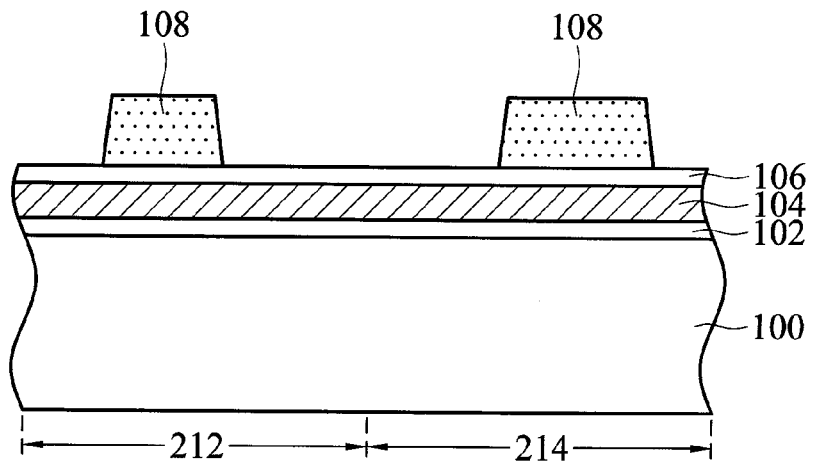
FIGS. 4a to 4e are cross section views showing a fabrication process for another exemplary embodiment of conductive lines and bonding pads of the invention.
Figure 4B:
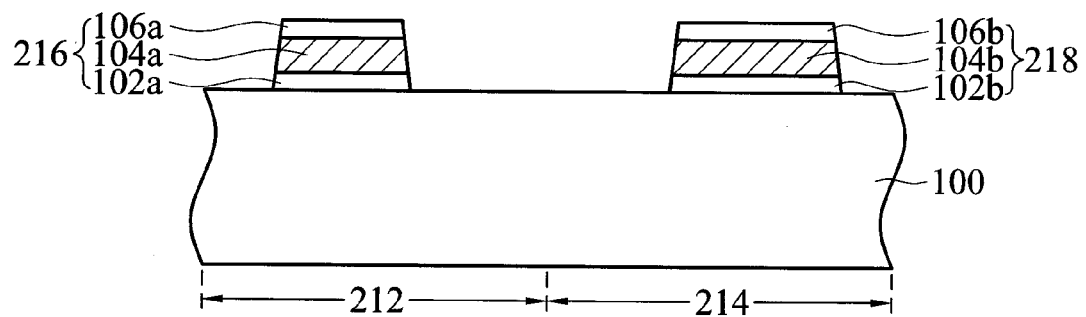

FIGS. 4a to 4e are cross section views showing a fabrication process for another exemplary embodiment of conductive lines and bonding pads of the invention. Process steps as shown in FIGS. 4a and 4b are the same as the process steps as shown in FIGS. 3a and 3b and are not described further herein for brevity.

Figure 4C:
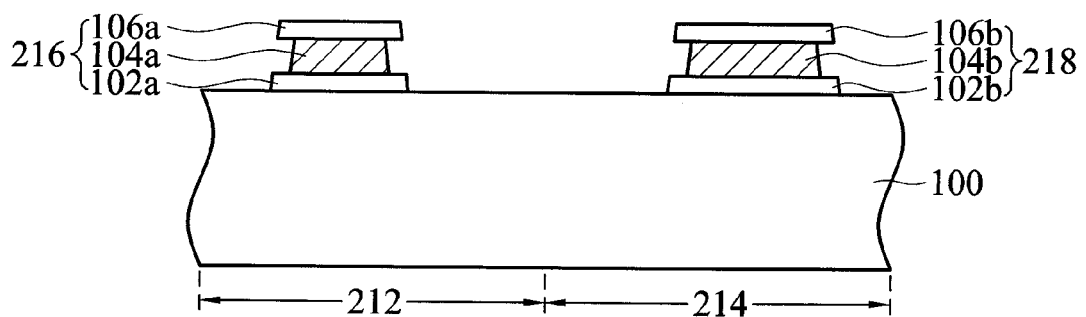

Referring to FIG. 4c, the differences between FIG. 4c and FIG. 3c is that the photoresist pattern covering the pad area 214 is not formed. That is, when the middle metal line 104a is isotropically etched using the wet etching process, the middle metal pad 104b is also etched, such that the width of the middle metal line 104a is narrower than those of the upper metal line 106a and the lower metal line 102a. Additionally, the width of the middle metal pad 104b is narrower than those of the upper metal pad 106b and the lower metal pad 102b.

In one embodiment, a subsequently formed conductive protection layer 220 cracks easily due to a concaved middle metal pad 104b of the bonding pad 218. Therefore, the process steps as shown in FIGS. 4d and 4e may be performed to prevent the conductive protection layer 220 from cracking.

Figure 4D:
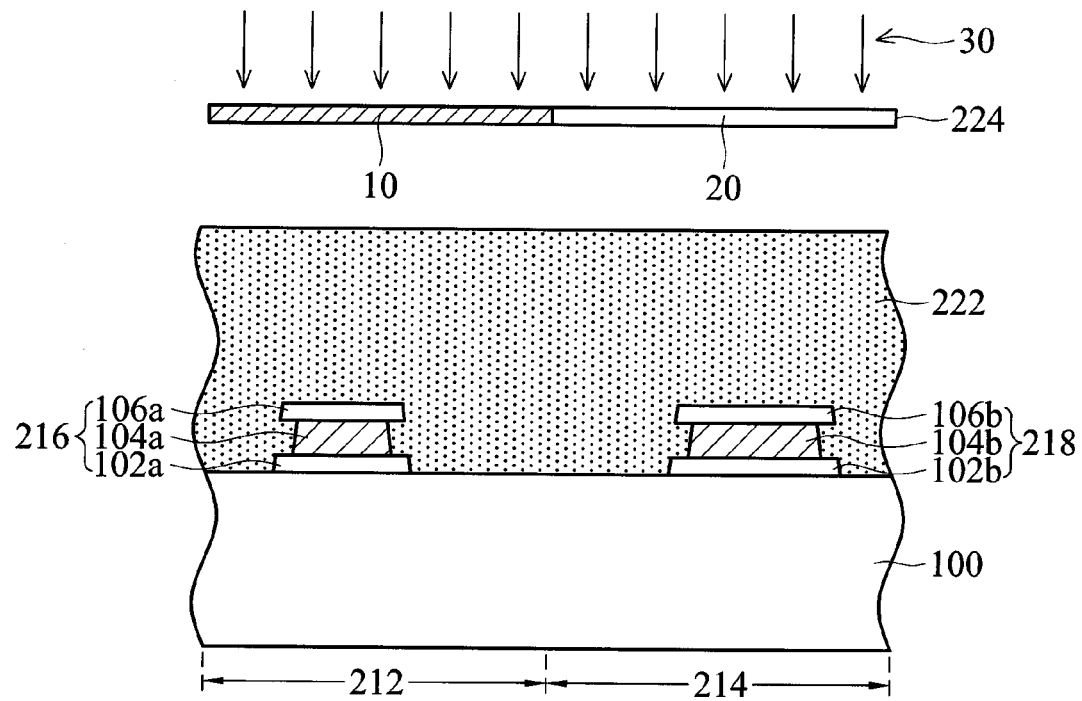
Figure 4E:
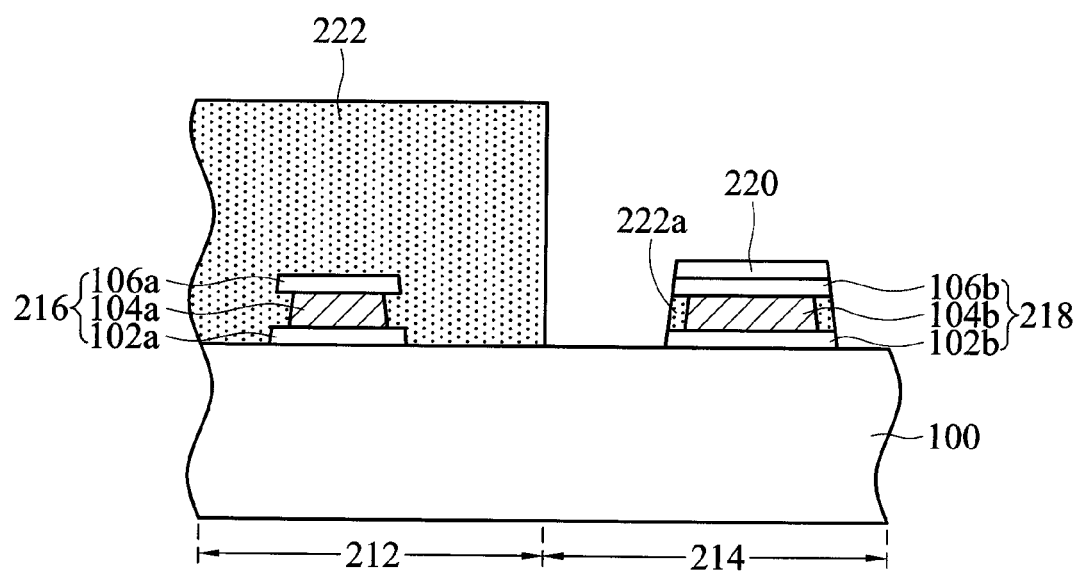
Figure 4D:
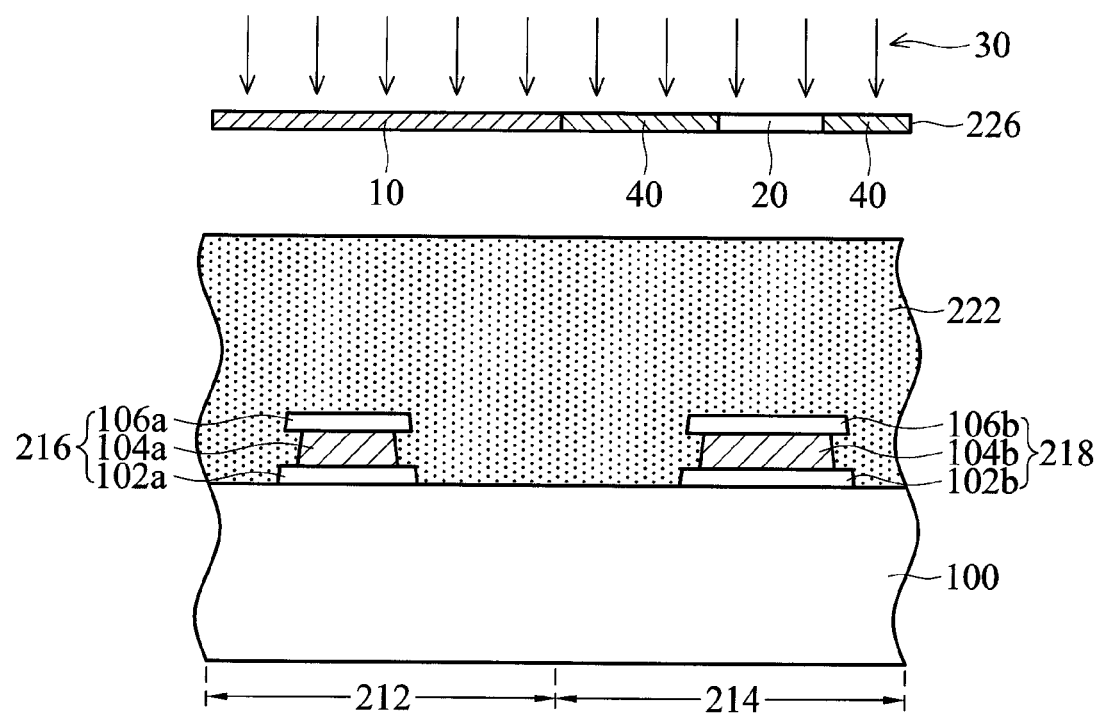
Figure 4E:
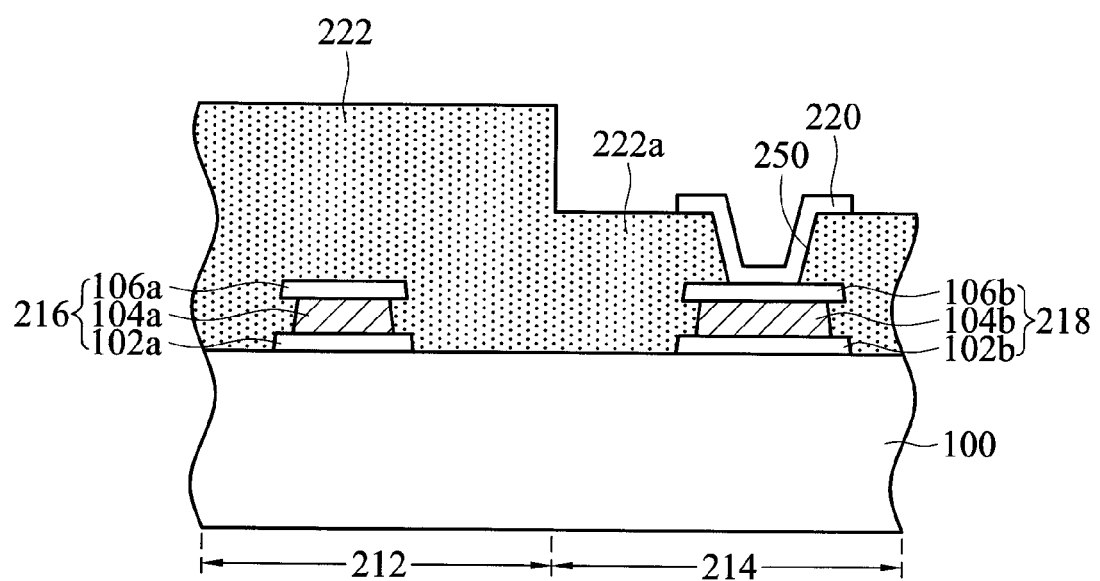

As shown in FIG. 4d, a photosensitive planarization layer 222 is formed on the display area 212 and the pad area 214. One exemplary embodiment of the photosensitive planarization layer 222, for example, a photosensitive planarization layer having positive photoresists, in the pad area 214 is optionally exposed by a light 30 such as an ultra-violet (UV) light irradiating through a mask 224 comprising opaque areas 10 and transparent areas 20. Next, a development step is performed using a developer to remove an exposed portion of the photosensitive planarization layer 222, by a photochemical reaction, thereby leaving photosensitive material 222a on the sidewalls of the middle metal bonding pad 104b and between the upper metal pad 106b and lower metal pad 102b. As shown in FIG. 4e, a width of the upper metal pad 106b is wider than that of the middle metal bonding pad 104b. The upper metal pad 106b may block a portion of the photosensitive planarization layer 222, thereby leaving photosensitive material 222a. Next, a conductive protection layer 220 is formed on the upper metal pad 106b. The conductive protection layer 220 is also formed on the sidewalls of the bonding pad 218.

Process steps as shown in FIGS. 4d' and 4e' may also be performed after performing the process steps as shown in FIG. 4c to prevent the conductive protection layer 220 from cracking.

The differences between FIG. 4d' and FIG. 4d is that a mask 226 as shown in FIG. 4d' is used to replace the mask 224 as shown in FIG. 4d. The mask 226 is a half-tone mask comprising opaque areas 10, transparent areas 20 and half-transparent areas 40, wherein the opaque areas 10 are aligned to the display area 212, the transparent areas 20 are aligned to the central portion of the upper metal pad 106b and the half-transparent areas 40 are aligned to an area adjacent to the central portion of the upper metal pad 106b. The photosensitive planarization layer 222 in the pad area 214 is optionally exposed by a light 30 such as a ultra-violet (UV) light irradiating through a mask 226. Next, a development step is performed using a developer to remove an exposed portion of the photosensitive planarization layer 222, by a photochemical reaction, thereby leaving photosensitive material 222a on the substrate 100 in the pad area 214 and the bonding pad 218. The photosensitive material 222a has an opening 250 to expose the upper metal pad 106b of the bonding pad 218. Next, a conductive protection layer 220 is formed on the upper metal pad 106b and the photosensitive material 222a. The photosensitive material 222a formed in the pad area 214, not only can prevent the bonding pad 218 from oxidation, but also can prevent the conductive protection layer 220 from cracking because the conductive protection layer 220 does not need to be formed on the bonding pad having sidewalls with a concave portion.

Figure 5:
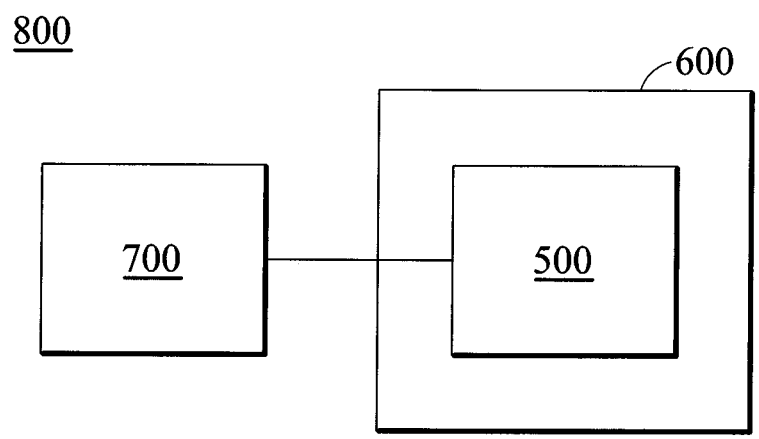
FIG. 5 schematically shows an arrangement of a system for displaying images comprising a liquid crystal display panel of the invention.

Next, referring to FIG. 5, FIG. 5 schematically shows an arrangement of a system 800 for displaying images comprising a liquid crystal display panel 500 of the invention. The system 800 comprises a liquid crystal display 600, and the liquid crystal display 600 comprises the liquid crystal display panel 500 according to the embodiments of the invention, a pair of polarizers sandwiching the liquid crystal display panel 500, and a backlight device disposed under the lower polarizer. The liquid crystal display 600 can be a part of an electronic device. In general, the system 800 for displaying images comprises the liquid crystal display 600 and an input unit 700. The input unit 700 is coupled to the liquid crystal display 600 and is operative to provide input to the liquid crystal display 600 such that the liquid crystal display 600 displays images. The liquid crystal display 600 according to the embodiments of the invention may comprise twisted nematic (TN) liquid crystal displays, super twisted nematic (STN) liquid crystal displays, multi-domain vertical alignment (MVA) liquid crystal displays, in-plane switching (IPS) liquid crystal displays, fringe field switching (FFS) liquid crystal displays and other types of liquid crystal displays. The system 800 for displaying images can be a mobile phone, digital camera, personal digital assistant (PDA), notebook computer, desktop computer, television, car display or portable DVD player.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
   a thin film transistor substrate, comprising:
      a substrate having a display area and a pad area;
      a conductive line disposed on the substrate in the display area comprising a lower metal line, an upper metal line and a middle metal line disposed directly between the upper metal line and the lower metal line, wherein a width of the middle metal line is narrower than that of the upper metal line and that of the lower metal line;
      a bonding pad disposed in the pad area, wherein the bonding pad comprises a lower metal bonding pad, a middle metal bonding pad and an upper metal bonding pad, wherein a width the middle metal bonding pad is narrower than that of the upper metal bonding pad and the lower bonding pad;
      a photo-sensitive material on the sidewalls of the middle metal bonding pad and between the upper metal pad and lower metal pad; and
      a conductive protection layer covering the upper metal pad.

2. The system for displaying images as claimed in claim 1, further comprising:
   a photo-sensitive material formed on the substrate and the bonding pad, having an opening to expose the upper metal bonding pad; and
   a conductive protection layer covering the upper metal pad and the photo-sensitive material.

* * * * *